(12) United States Patent
Shin (10) Patent No.: US 8,508,274 B2
(45) Date of Patent: Aug. 13, 2013

(54) DUTY CORRECTION CIRCUIT

(75) Inventor: Dong Suk Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 40 days.

(21) Appl. No.: 13/341,436

(22) Filed: Dec. 30, 2011

(65) Prior Publication Data

US 2012/0293225 A1 Nov. 22, 2012

(30) Foreign Application Priority Data

May 16, 2011 (KR) .................. 10-2011-0045711

(51) Int. Cl.
*H03K 3/017* (2006.01)

(52) U.S. Cl.
USPC ........................................ 327/175; 327/172

(58) Field of Classification Search
USPC .................................................. 327/172–176
See application file for complete search history.

(56) References Cited

U.S. PATENT DOCUMENTS

| 6,643,790 | B1 * | 11/2003 | Yu et al. ........................ 713/500 |
| 6,859,081 | B2 | 2/2005 | Hong et al. |
| 6,900,681 | B2 * | 5/2005 | Takano ........................ 327/175 |
| 6,934,215 | B2 | 8/2005 | Chung et al. |
| 7,180,346 | B2 | 2/2007 | Lee |
| 7,642,828 | B2 * | 1/2010 | Sakai ........................ 327/175 |
| 7,928,738 | B2 * | 4/2011 | Sip ........................ 324/538 |

FOREIGN PATENT DOCUMENTS

| KR | 1020100002651 A | 1/2010 |
| KR | 1020100049943 A | 5/2010 |
| KR | 1020100122673 A | 11/2010 |

* cited by examiner

*Primary Examiner* — An Luu
(74) *Attorney, Agent, or Firm* — William Park & Associates Patent Ltd.

(57) ABSTRACT

A duty correction circuit includes a clock buffer configured to buffer an input clock and generate a buffer clock, a swing level conversion block configured to generate an internal clock, which transitions to levels of a sync voltage and a power supply voltage, in response to a voltage level of the buffer clock, a duty control block configured to generate duty information and frequency information by using a high pulse width and a low pulse width of the internal clock, and a current control block configured to control a time point, at which a logic value of the buffer clock transitions, in response to the duty information and the frequency information. The current control block includes a plurality of first current paths coupled in parallel to one another in order to control the time point at which the logic value of the buffer clock transitions.

26 Claims, 7 Drawing Sheets

DUTY CORRECTION CIRCUIT

CROSS-REFERENCES TO RELATED APPLICATION

The present application claims priority under 35 U.S.C. §119(a) to Korean application number 10-2011-045711, filed on May 16, 2011, in the Korean Intellectual Property Office, which is incorporated herein by reference in its entirety as set forth in full.

BACKGROUND

1. Technical Field

The present invention relates to a semiconductor integrated circuit, and more particularly, to a duty correction circuit for correcting the duty of a clock.

2. Related Art

A general duty correction circuit compares a high pulse width with a low pulse width of a clock and corrects the duty ratio of the clock according to a comparison result. Since such a duty correction circuit compares the high pulse width with the low pulse width of the clock several times and completes the clock duty correction, a long time is required until the duty correction is completed. Furthermore, in the general duty correction circuit that compares the high pulse width with the low pulse width of the clock, that is, detects the duty of the clock, since offset exists, it is difficult to accurately detect the duty of the clock and there is a limitation in a frequency range of a clock subject to the duty correction, that is, a clock which is input to the duty correction circuit.

SUMMARY

A duty correction circuit, in which a short time is required until clock duty correction is completed, duty correction is accurately performed, and a frequency range permitting duty correction is wide as compared with the conventional art, is described herein.

An embodiment includes a duty correction circuit comprising: a clock buffer configured to buffer an input clock and generate a buffer clock; a swing level conversion block configured to generate an internal clock, which transitions to levels of a sync voltage and a power supply voltage, in response to a voltage level of the buffer clock; a duty control block configured to generate duty information and frequency information by using a high pulse width is and a low pulse width of the internal clock; and a current control block configured to control a time point, at which a logic value of the buffer clock transitions, in response to the duty information and the frequency information. The current control block may comprise: a plurality of first current paths coupled in parallel to one another in order to control the time point at which the logic value of the buffer clock transitions, wherein a total amount of current flowing through the plurality of first current paths is controlled in response to the frequency information, and a variation in the total amount of current flowing through the plurality of first current paths with respect to a variation in the frequency information is changed according to a frequency domain.

Another embodiment may include a duty correction circuit comprising: a current control block configured to receive duty information and frequency information and control a time point at which a logic value of a buffer clock transitions in response to the duty information and the frequency information, wherein the current control block further comprises: a plurality of current paths coupled in parallel to one another in order to control the time point at which the logic value transitions, wherein a total amount of current flowing through the plurality of first current paths is controlled in response to the frequency information, and a variation in the total amount of current flowing through the plurality of first current paths with respect to a variation in the frequency information is changed is according to a frequency domain.

BRIEF DESCRIPTION OF THE DRAWINGS

Features, aspects, and embodiments are described in conjunction with the attached drawings, in which.

DETAILED DESCRIPTION

Hereinafter, a duty correction circuit according to embodiments of the present invention will be described in detail with reference to the accompanying drawings through an example embodiment.

Figure 1:
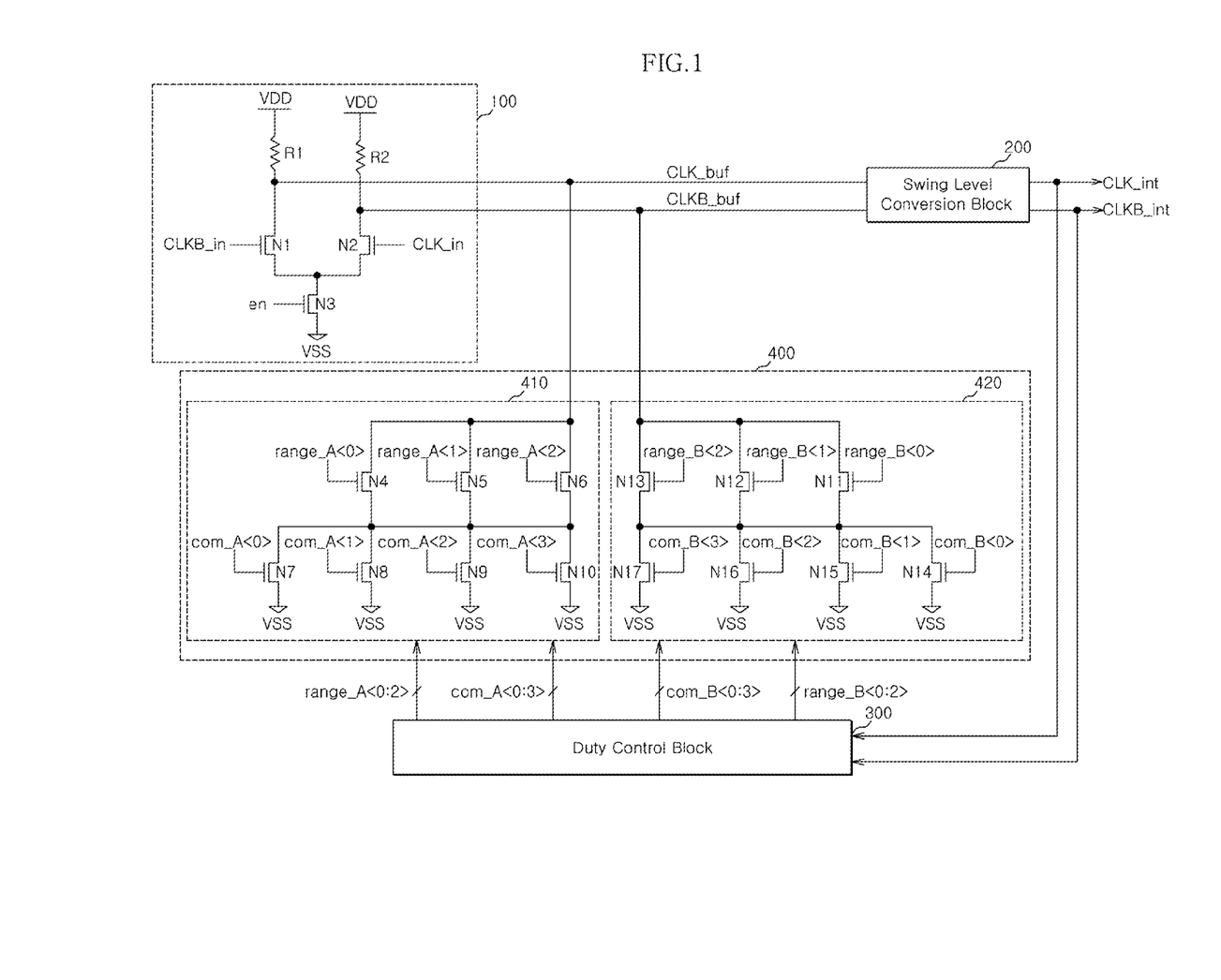
FIG. 1 is a configuration diagram schematically illustrating a duty correction circuit according to an embodiment.

As illustrated in FIG. 1, a duty correction circuit according to an embodiment may include a clock buffer 100, a swing level conversion block 200, a duty control block 300, and a current control block 400.

The clock buffer 100 is a current mode logic (CML) type buffer, and buffers input clocks CLK_in and CLKB_in and generates a buffer clock CLK_buf and an inverted buffer clock CLKB_buf.

The clock buffer 100 includes first and second resistors R1 and R2, and first to third transistors N1 to N3.

The first resistor R1 receives a power supply voltage VDD through an end thereof. The second resistor R2 receives the power supply voltage VDD through an end thereof. The first transistor N1 receives the input clock CLK_in through a gate thereof, and has a drain coupled to the other end of the first resistor R1. The second transistor N2 receives the inverted clock CLKB_in of the input clock CLK_in through a gate thereof, and has a drain coupled to the other end of the second resistor R2. The third transistor N3 has a drain coupled to a node to which the sources of the first and second resistors R1 and R2 are coupled, a gate to which an enable signal en is input, and a source coupled to a ground terminal VSS. The enable signal en may be a digital signal with a high or low level, or a bias voltage with a specific level.

The swing level conversion block 200 is configured to generate an internal clock CLK_int and an inverted internal clock CLKB_int, which transitions to the levels of a sync voltage VSS and the power supply voltage VDD, in response to the buffer clock CLK_buf and the inverted buffer clock CLKB_buf. The buffer clock CLK_buf and the inverted buffer clock CLKB_buf have a current mode logic (CML) level, and the internal clock CLK_int and the inverted internal clock CLKB_int have a complementary metal oxide semiconductor (CMOS) level.

The duty control block 300 is configured to generate a size difference between a high pulse width and a low pulse width of the internal clock CLK_int as duty information com_A<0:3> and com_B<0:3>, and generate the size sum of the high pulse width and the low pulse width as frequency information range_A<0:2> and range_B<0:2>.

The current control block 400 is configured to control a time point at which the logic value of the buffer clock CLK_buf or the inverted buffer clock CLKB_buf transitions in response to the duty is information com_A<0:3> and com_B<0:3>, and the frequency information range_A<0:2> and range_B<0:2>.

The current control block 400 may include a plurality of first current paths coupled in parallel to one another in order to control the time point at which the logic value of the buffer clock CLK_buf or the inverted buffer clock CLKB_buf transitions. The total amount of current flowing through the plurality of first current paths is controlled in response to the frequency information range_A<0:2> and range_B<0:2>.

Furthermore, the current control block 400 may further include a plurality of second current paths coupled in series to the plurality of first current paths. The total amount of current flowing through the plurality of second current paths is controlled in response to the duty information com_A<0:3> and com_B<0:3>.

The duty control block 300 and the current control block 400 control the time point, at which the logic value of the buffer clock CLK_buf or the inverted buffer clock CLKB_buf transitions, according to the duty of the internal clock CLK_int, thereby correcting the duty of the internal clock CLK_int. In this regard, the duty control block 300 and the current control block 400 may be called a duty correction unit. For example, the duty correction unit 300 and 400 performs addition and subtraction for the sizes of the high pulse width and the low pulse width of the internal clock CLK_int, thereby controlling the time point at which the logic value of the buffer clock CLK_buf or the inverted buffer clock CLKB_buf transitions.

The current control block 400 may include a first current control unit 410 and a second current control unit 420. The first current control unit 410 is configured to control the time point at which the logic value of the buffer clock CLK_buf transitions. The second current control unit 420 is configured to control the time point at which the logic value of the inverted buffer clock CLKB_buf transitions.

The duty control block 300 outputs the duty information com_A<0:3> and com_B<0:3> and the frequency information range_A<0:2> and range_B<0:2> to the first current control unit 410 and the second current control unit 420. However, only one of the first current control unit 410 and the second current control unit 420 controls the time point at which the logic value of the buffer clock CLK_buf or the inverted buffer clock CLKB_buf transitions.

Only one of the first current control unit 410 and the second current control unit 420 controls the time point at which the logic value of the buffer clock CLK_buf or the inverted buffer clock CLKB_buf transitions, so that the duty correction circuit may have a low duty correction resolution.

The first current control unit 410 includes fourth to sixth transistors N4 to N6 as one of the plurality of first current paths. The fourth to sixth transistors N4 to N6 receive respective bits of the frequency information range_A<0:2> through gates thereof, respectively. The drains of the fourth to sixth transistors N4 to N6 are coupled to a path through which the clock buffer 100 and the is swing level conversion block 200 are coupled to each other and the buffer clock CLK_buf is transmitted. The fourth to sixth transistors N4 to N6 may have different sizes.

The first current control unit 410 includes seventh to tenth transistors N7 to N10 as one of the plurality of second current paths. The seventh to tenth transistors N7 to N10 receive respective bits of the duty information com_A<0:3> through gates thereof, respectively. The seventh to tenth transistors N7 to N10 have drains coupled to nodes to which the sources of the fourth to sixth transistors N4 to N6 are commonly coupled, and sources coupled to a ground terminal VSS. The seventh to tenth transistors N7 to N10 may have different sizes.

The second current control unit 420 includes eleventh to thirteenth transistors N11 to N13 as the other one of the plurality of first current paths. The eleventh to thirteenth transistors N11 to N13 receive respective bits of the frequency information range_B<0:2> through gates thereof, respectively. The drains of the eleventh to thirteenth transistors N11 to N13 are coupled to a path through which the clock buffer 100 and the swing level conversion block 200 are coupled to each other and the inverted buffer clock CLKB_buf is transmitted. The eleventh to thirteenth transistors N11 to N13 may have different sizes.

The second current control unit 420 includes fourteenth to seventeenth transistors N14 to N17 as the other one of the plurality of second current paths. The fourteenth to seventeenth transistors N14 to N17 receive respective bits of the duty information com_B<0:3> through gates thereof, respectively. The fourteenth to seventeenth transistors N14 to N17 have drains coupled to nodes to which the sources of the eleventh to thirteenth transistors N11 to N13 are commonly coupled, and sources coupled to the ground terminal VSS. The fourteenth to seventeenth transistors N14 to N17 may have different sizes.

As illustrated in FIG. 1, the duty information com_A<0:3> and com_B<0:3> is a digital code of plural bits. In a semiconductor apparatus including the duty correction circuit, the input clocks CLK_in and CLKB_in may not be input for a predetermined time or more as the occasion demands (for example, for power saving). In the duty correction circuit, when the duty information com_A<0:3> and com_B<0:3> are set as an analog voltage, if the input clocks CLK_in and CLKB_in are not input for a predetermined time and then are input again, since it is necessary to find an optimal duty correction value again, a long duty correction time may be required to find an optimal duty correction value again.

Differently from this, according to the duty correction circuit, the duty information com_A<0:3> and com_B<0:3> are set as the digital code of plural bits as illustrated in FIG. 1 and a separate register for storing the duty information com_A<0:3> and com_B<0:3> is further provided, or a semiconductor apparatus having the same, therefore it is possible to directly use the stored optimal duty information com_A<0:3> and com_B<0:3>. Consequently, it is possible to reduce a duty correction time.

Figure 2:
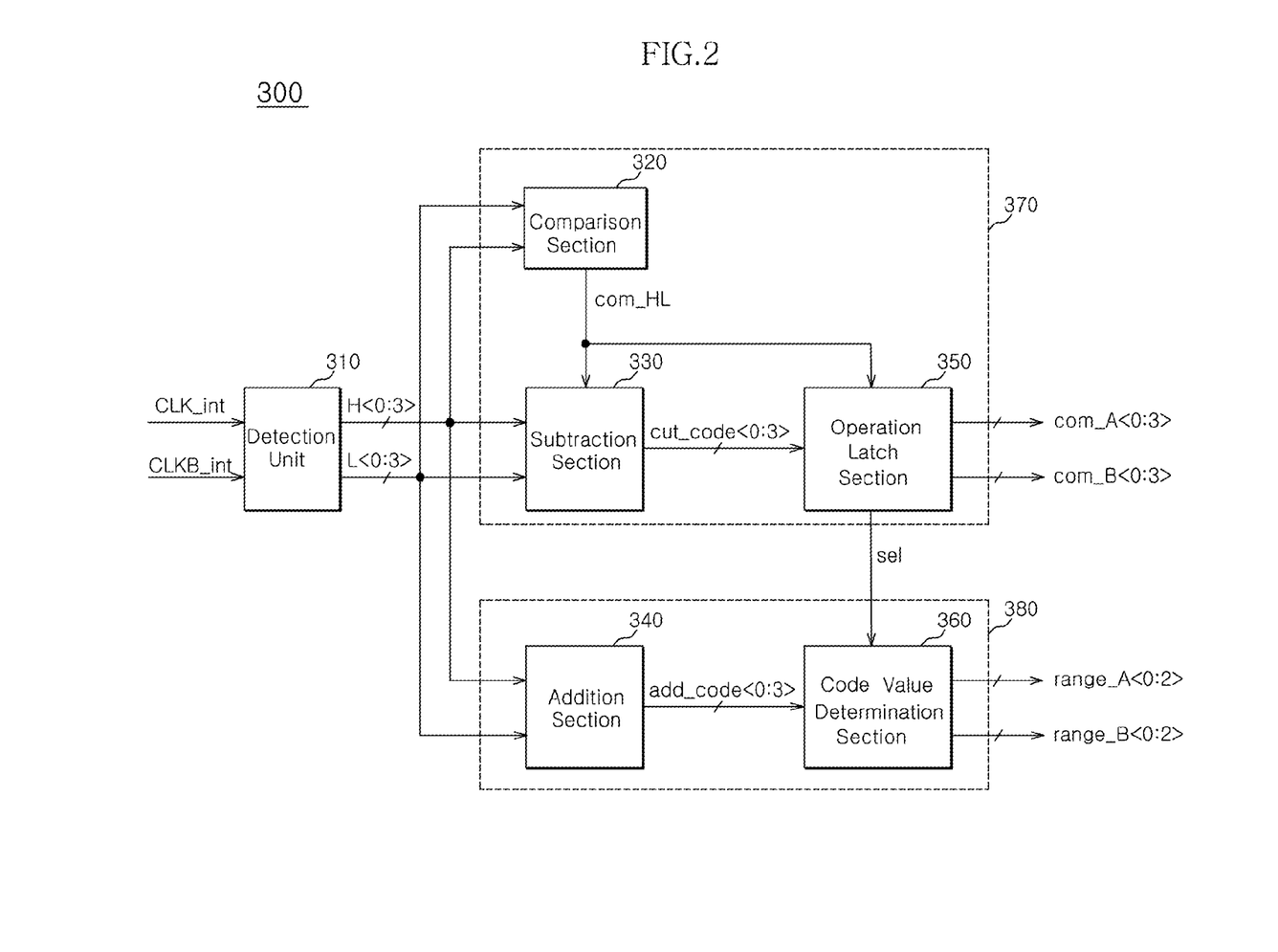
FIG. 2 is a configuration diagram of a duty control block of FIG. 1.

As illustrated in FIG. 2, the duty control block 300 may include a detection unit 310, a duty information generation unit 370, and a frequency information generation unit 380.

The detection unit 310 is configured to receive the internal clock CLK_int and the inverted internal clock CLKB_int, generate high codes H<0:3> having code values corresponding to the size of the high pulse width of the internal clock CLK_int, and generate low codes L<0:3> having code values corresponding to the size of the low pulse width of the internal clock CLK_int.

The duty information generation unit 370 is configured to perform subtraction for the high codes H<0:3> and the low codes L<0:3> to generate subtraction codes cut_code<0:3>, and generate the duty information com_A<0:3> and com_B<0:3> based on the subtraction codes cut_code<0:3>. The duty information com_A<0:3> and com_B<0:3> based on the subtraction codes cut_code<0:3> is used to operate only one of the first current control unit 410 and the second current control unit 420. For example, the first current control unit 410 controls the time point, at which the logic value of the buffer clock CLK_buf transitions, according to the duty information com_A<0:3>, or the second current control unit 420 controls the time point, at which the logic value of the inverted buffer clock CLKB_buf transitions, according to the duty information com_B<0:3>.

The duty information generation unit 370 includes a is comparison section 320, a subtraction section 330, and an operation latch section 350.

The comparison section 320 is configured to compare the code values of the high codes H<0:3> with the code values of the low codes L<0:3>, and generate a code comparison signal com_HL. For example, when the code values of the high codes H<0:3> are larger than the code values of the low codes L<0:3>, the comparison section 320 activates the code comparison signal com_HL. However, when the code values of the low codes L<0:3> are larger than the code values of the high codes H<0:3>, the comparison section 320 deactivates the code comparison signal com_HL.

The subtraction section 330 is configured to subtract a small one from a large one of the code values of the high codes H<0:3> and the low codes L<0:3> in response to the code comparison signal com_HL, and outputs a subtraction result as the subtraction codes cut_code<0:3>. For example, when the code comparison signal com_HL is activated, the subtraction section 330 subtracts the code values of the low codes L<0:3> from the code values of the high codes H<0:3>. When the code comparison signal com_HL is deactivated, the subtraction section 330 subtracts the code values of the high codes H<0:3> from the code values of the low codes L<0:3>.

The operation latch section 350 is configured to perform subtraction or addition for the subtraction codes cut_code<0:3> and latch codes (latch_code<0:4> illustrated in FIG. 6) in response to the is code comparison signal com_HL, and generate the duty information com_A<0:3> and com_B<0:3>. The most significant bit latch_code<4> of the latch codes latch_code<0:4> is output as a selection signal sel.

The frequency information generation unit 380 is configured to perform addition for the high codes H<0:3> and the low codes L<0:3> to generate addition codes add_code<0:3>, and generate the frequency information range_A<0:2> and range_B<0:2> based on the addition codes add_code<0:3>. The frequency information range_A<0:2> and range_B<0:2> based on the addition codes add_code<0:3> are used to operate only one of the first current control unit 410 and the second current control unit 420. For example, the first current control unit 410 controls the time point, at which the logic value of the buffer clock CLK_buf transitions, according to the frequency information range_A<0:2>, or the second current control unit 420 controls the time point, at which the logic value of the inverted buffer clock CLKB_buf transitions, according to the frequency information range_B<0:2>.

The frequency information generation unit 380 includes an addition section 340 and a code value determination section 360. The frequency information range_A<0:2> and range_B<0:2> includes first to third frequency signals (fre_H, fre_M, and fre_L illustrated in FIG. 8).

The addition section 340 is configured to perform the addition for the high codes H<0:3> and the low codes L<0:3> and is generate the addition codes add_code<0:3>.

When the code values of the addition codes add_code<0:3> are larger than a first setting code value, the code value determination section 360 activates the first frequency signal fre_H of the first to third frequency signals fre_H, fre_M, and fre_L. When the code values of the addition codes add_code<0:3> are smaller than the first setting code value and larger than a second setting code value, the code value determination section 360 activates the second frequency signal fre_M of the first to third frequency signals fre_H, fre_M, and fre_L. When the code values of the addition codes add_code<0:3> are smaller than the second setting code value, the code value determination section 360 activates the third frequency signal fre_L of the first to third frequency signals fre_H, fre_M, and fre_L. Furthermore, the code value determination section 360 outputs the first to third frequency signals fre_H, fre_M, and fre_L to the first current control unit 410 or the second current control unit 420 as the frequency information range_A<0:2> and range_B<0:2> in response to the selection signal sel.

Figure 3:
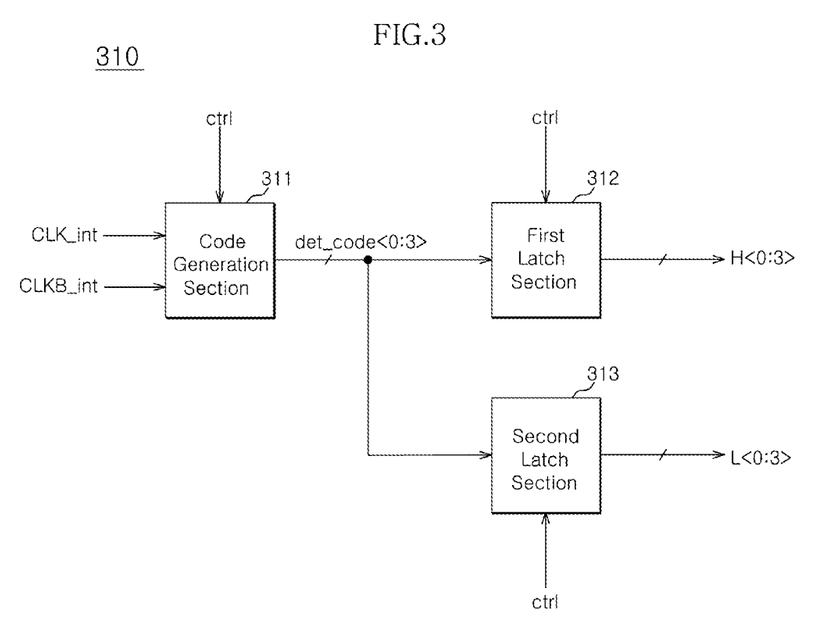
FIG. 3 is a configuration diagram of a detection unit of FIG. 2.

As illustrated in FIG. 3, the detection unit 310 may include a code generation section 311, a first latch section 312, and a second latch section 313.

The code generation section 311 is configured to generate detection codes det_code<0:3> corresponding to the size of the high pulse width of the internal clock CLK_int or generate detection codes det_code<0:3> corresponding to the size of the low pulse width of is the internal clock CLK_int in response to a control signal ctrl. The control signal ctrl may be the internal clock CLK_int. For example, when the internal clock CLK_int is at a high level, the code generation section 311 generates the detection codes det_code<0:3> corresponding to the size of the high pulse width of the internal clock CLK_int. However, when the internal clock CLK_int is at a low level, the code generation section 311 generates the detection codes det_code<0:3> corresponding to the size of the low pulse width of the internal clock CLK_int.

When the control signal ctrl is at a high level, that is, when the internal clock CLK_int is at a high level, the first latch section 312 latches the detection codes det_code<0:3> and outputs the high codes H<0:3>.

When the control signal ctrl is at a low level, that is, when the internal clock CLK_int is at a low level, the second latch section 313 latches the detection codes det_code<0:3> and outputs the low codes L<0:3>.

Figure 4:
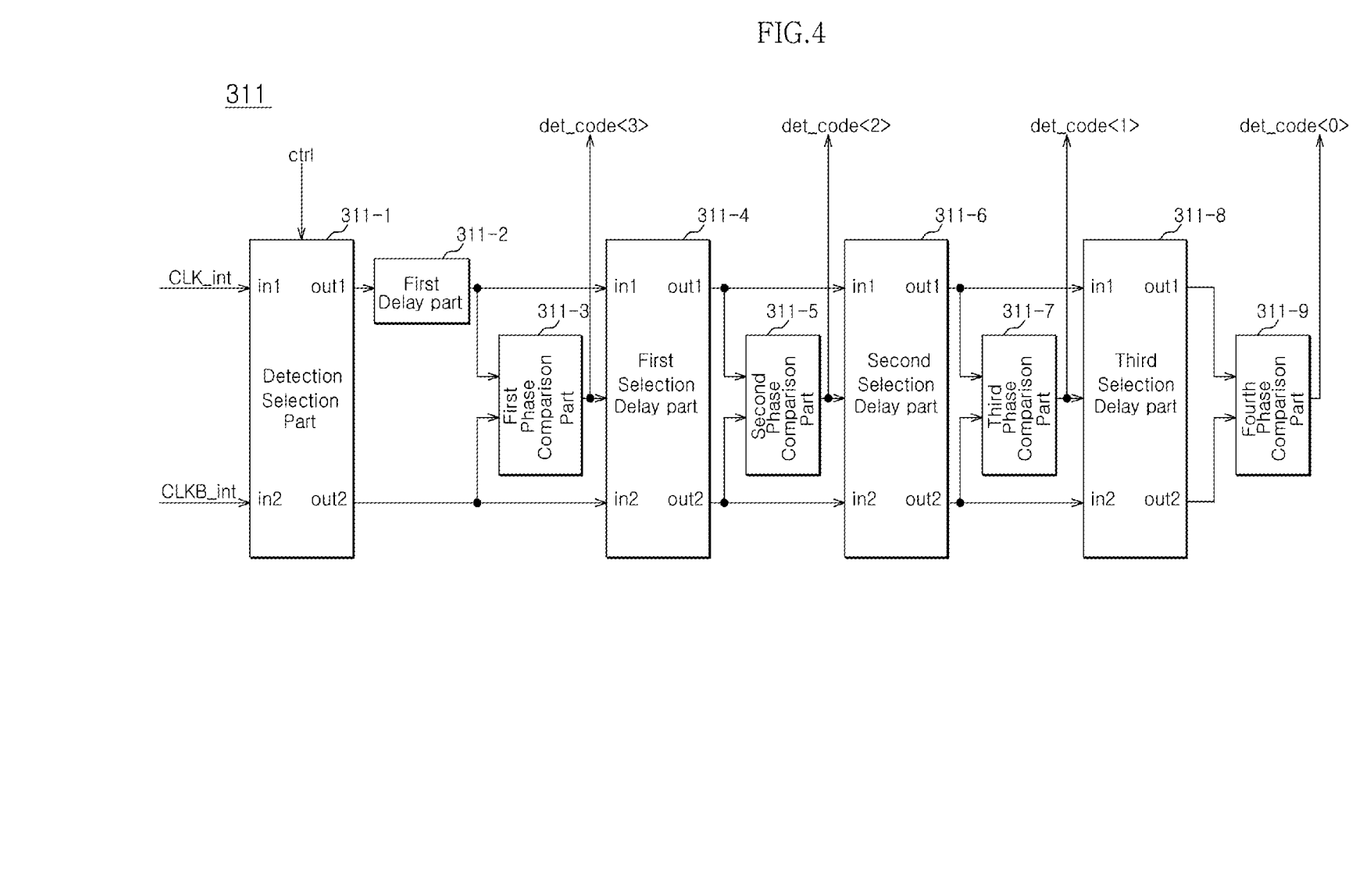
FIG. 4 is a configuration diagram of a code generation section of FIG. 3.

As illustrated in FIG. 4, the code generation section 311 may include a detection selection part 311-1, a first delay part 311-2, a first phase comparison part 311-3, a first selection delay part 311-4, a second phase comparison part 311-5, a second selection delay part 311-6, a third phase comparison part 311-7, a third selection delay part 311-8, and a fourth phase comparison part 311-9.

At this time, the detection codes det_code<0:3> include first to fourth detection signals det_code<3>, det_code<2>, det_code<1>, and det_code<0>.

When the internal clock CLK_into is activated, that is, when the internal clock CLK_int is at a high level, the detection selection part 311-1 outputs the internal clock CLK_int to a first output terminal out1 thereof, and outputs the inverted internal clock CLKB_int, which is obtained by inverting the internal clock CLK_int, to a second output terminal out2 thereof. However, when the internal clock CLK_int is deactivated, that is, when the internal clock CLK_int is at a low level, the detection selection part 311-1 outputs the internal clock CLK_int to the second output terminal out2, and outputs the inverted internal clock CLKB_int to the first output terminal out1. The detection selection part 311-1 includes a first input terminal for receiving the internal clock CLK_int, and a second input terminal for receiving the inverted internal clock CLKB_int.

The first delay part 311-2 is configured to delay a signal which is output from the first output terminal out1 of the detection selection part 311-1.

The first phase comparison part 311-3 is configured to compare a phase of an output signal of the first delay part 311-2 with a phase of a signal which is output from the second output terminal of the detection selection part 311-1, and output the first detection signal det_code<3>. For example, when the phase of the output signal of the first delay part 311-2 is advanced as compared with the phase of the signal which is output from the second output terminal of the detection selection part 311-1, the first phase comparison part 311-3 activates the first detection signal det_code<3>. However, when the phase of the output signal of the first delay part 311-2 is delayed as compared with the phase of the signal which is output from the second output terminal of the detection selection part 311-1, the first phase comparison part 311-3 deactivates the first detection signal det_code<3>.

The first selection delay part 311-4 is configured to delay the signal received from the first delay part 311-2 or the signal, which is received from the second output terminal of the detection selection part 311-1, in response to the first detection signal det_code<3>. For example, when the first detection signal det_code<3> is activated, the first selection delay part 311-4 delays the signal received from the first delay part 311-2 to output a delayed signal to a first output terminal out1 thereof, and outputs the signal which is received from the second output terminal of the detection selection part 311-1 to a second output terminal out2 thereof. However, when the first detection signal det_code<3> is deactivated, the first selection delay part 311-4 outputs the signal received from the first delay part 311-2 to the first output terminal out1, and delays the signal which is received from the second output terminal of the detection selection part 311-1 to output a delayed signal to the second output terminal out2 of the first selection delay part 311-4.

The second phase comparison part 311-5 is configured to compare the phases of signals, which are output from the first and second terminals out1 and out2 of the first selection delay part 311-4, with each other, and generate the second detection signal det_code<2>. For example, when the phase of the signal output from the first terminal out1 of the first selection delay part 311-4 is advanced as compared with the phase of the signal output from the second terminal out2 of the first selection delay part 311-4, the second phase comparison part 311-5 activates the second detection signal det_code<2>. However, when the phase of the signal output from the first terminal out1 of the first selection delay part 311-4 is delayed as compared with the phase of the signal output from the second terminal out2 of the first selection delay part 311-4, the second phase comparison part 311-5 deactivates the second detection signal det_code<2>.

The second selection delay part 311-6 is configured to delay the signal received from the first terminal of the first selection delay part 311-4 or the signal received from the second terminal of the first selection delay part 311-4, in response to the second detection signal det_code<2>. For example, when the second detection signal det_code<2> is activated, the second selection delay part 311-6 delays the signal received from the first selection delay part 311-4 to output a delayed signal to a first output terminal out1 thereof, and outputs the signal received from the second terminal of the first selection delay part 311-4 to a second output terminal out2 thereof. However, when the second detection signal det_code<2> is deactivated, the second selection delay part 311-6 outputs the signal received from the first selection delay part 311-4 to the first output terminal out1, and delays the signal received from the second terminal of the first selection delay part 311-4 to output a delayed signal to the second output terminal out2 of the second selection delay part 311-6.

The third phase comparison part 311-7 is configured to compare the phases of signals (which are output from the first and second output terminals out1 and out2 of the second selection delay part 311-6) with each other, and generate the third detection signal det_code<1>. For example, when the phase of the signal output from the first output terminal out1 of the second selection delay part 311-6 is advanced as compared with the phase of the signal output from the second out terminal out2 of the second selection delay part 311-6, the third phase comparison part 311-7 activates the third detection signal det_code<1>. However, when the phase of the signal output from the first output terminal out1 of the second selection delay part 311-6 is delayed as compared with the phase of the signal output from the second output terminal out2 of the second selection delay part 311-6, the third phase comparison part 311-7 deactivates the third detection signal det_code<1>.

The third selection delay part 311-8 is configured to delay the signal received from the first terminal of the second selection delay part 311-6 or the signal received from the second output terminal of the second selection delay part 311-6, in response to the third detection signal det_code<1>. For example, when the third detection signal det_code<1> is activated, the third selection delay part 311-8 delays the signal received from the second selection delay part 311-6 to output a delayed signal to a first output terminal out1 thereof, and outputs the signal received from the second output terminal of the second selection delay part 311-6 to a second output terminal out2 thereof. However, when the third detection signal det_code<1> is deactivated, the third selection delay part 311-8 outputs the signal received from the second selection delay part 311-6 to the first output terminal out1, and delays the signal received from the second output terminal of the second selection delay part 311-6 to output a delayed signal to the second output terminal out2 of the third selection delay part 311-8.

The fourth phase comparison part 311-9 is configured to compare the phases of signals, which are output from the first and second output terminals out1 and out2 of the third selection delay part 311-8, with each other, and generate the fourth detection signal det_code<0>. For example, when the phase of the signal output from the first output terminal out1 of the third selection delay part 311-8 is advanced as compared with the phase of the signal output from the second output terminal out2 of the third selection delay part 311-8, the fourth phase comparison part 311-9 activates the fourth detection signal det_code<0>. However, when the phase of the signal output from the first terminal out1 of the third selection delay part 311-8 is delayed as compared with the phase of the signal output from the second terminal out2 of the third selection delay part 311-8, the fourth phase comparison part 311-9 deactivates the fourth detection signal det_code<0>.

The first to third selection delay parts 311-4, 311-6, and 311-8 have substantially the same configuration except for input/output signals. Accordingly, the configuration of the first selection delay part 311-4 will representatively be described, and descriptions about the configurations of the second and third selection delay parts 311-6 and 311-8 will be omitted in order to avoid redundancy.

Figure 5:
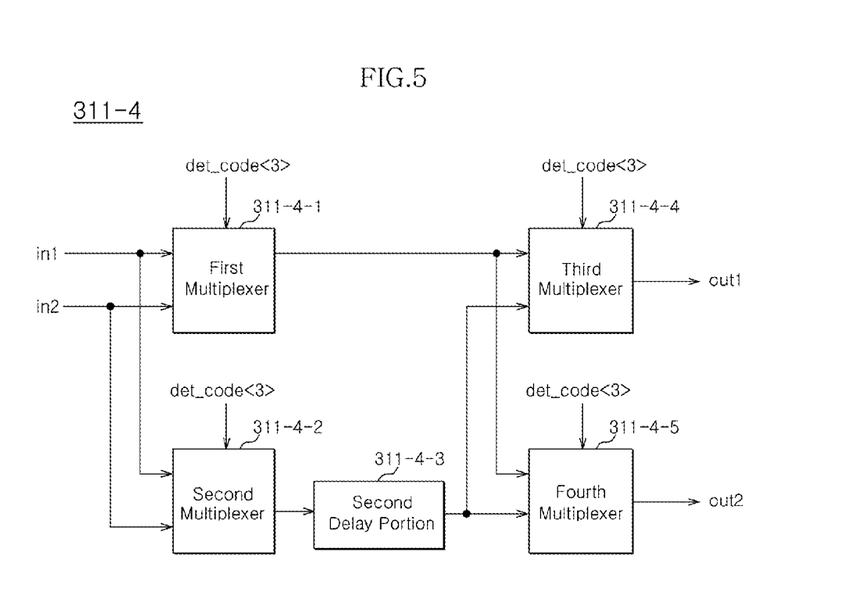
FIG. 5 is a configuration diagram of a first selection delay part of FIG. 4.

As illustrated in FIG. 5, the first selection delay part 311-4 may include first to fourth multiplexers 311-4-1, 311-4-2, 311-4-4, and 311-4-5, and a second delay portion 311-4-3.

The first multiplexer 311-4-1 is configured to selectively output a signal received from a first input terminal in1 thereof, that is, the signal received from the first delay part 311-2, or a signal received from a second input terminal in2 of the first multiplexor unit 311-4-1, which is, the signal received from the second output terminal of the detection selection part 311-1. The signal that the first multiplexer 311-4-1 selectively outputs, may be output in response to the first detection signal det_code<3>. At this time, when the first multiplexer 311-4-1 outputs the signal received from the first input terminal in1, the second multiplexer 311-4-2 outputs the signal received from the second input terminal in2. Meanwhile, when the first multiplexer 311-4-1 outputs the signal received from the second input terminal in2, the second multiplexer 311-4-2 outputs the signal received from the first input terminal in1.

The second delay portion 311-4-3 is configured to delay the signal which is output from the second multiplexer 311-4-2.

The third multiplexer 311-4-4 outputs the output signal of the first multiplexer 311-4-1 or the output signal of the second delay portion 311-4-3 as an output signal of a first output terminal out1 of the third multiplexer 311-4-4 in response to the first detection signal det_code<3>.

The fourth multiplexer 311-4-5 outputs the output signal of the first multiplexer 311-4-1 or the output signal of the second delay portion 311-4-3 as an output signal of a second output terminal out2 of the third multiplexer 311-4-4 in response to the first detection signal det_code<3>. At this time, when the third multiplexer 311-4-4 outputs the output signal of the first multiplexer 311-4-1, the fourth multiplexer 311-4-5 outputs the output signal of the second delay portion 311-4-3. Meanwhile, when the third multiplexer 311-4-4 outputs the output signal of the second delay portion 311-4-3, the fourth multiplexer 311-4-5 outputs the output signal of the first multiplexer 311-4-1. In further detail, when the first multiplexer 311-4-1 outputs the output signal of the first input terminal int, the third multiplexer 311-4-4 outputs the output signal of the first multiplexer 311-4-1. When the second multiplexer 311-4-2 outputs the output signal of the second input terminal in2, the fourth multiplexer 311-4-5 outputs the output signal of the second delay portion 311-4-3. Meanwhile, when the first multiplexer 311-4-1 outputs the output signal of the second input terminal in2, the fourth multiplexer 311-4-5 outputs the output signal of the first multiplexer 311-4-1. When the second multiplexer 311-4-2 outputs the output signal of the first input terminal int, the third multiplexer 311-4-4 outputs the output signal of the second delay portion 311-4-3.

Figure 6:
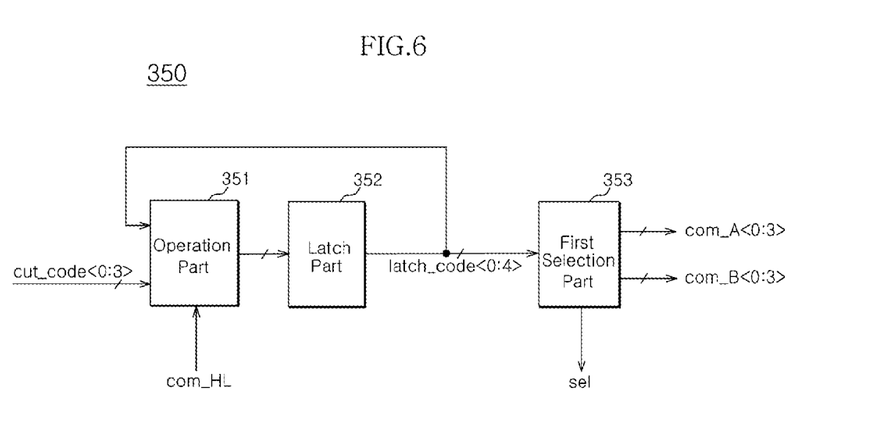
FIG. 6 is a configuration diagram of an operation latch section of FIG. 2.

As illustrated in FIG. 6, the operation latch section 350 of FIG. 2 may include an operation part 351, a latch part 352, and a first selection part 353.

The operation part 351 is configured to perform addition or subtraction for the subtraction codes cut_code<0:3> and the latch codes latch_code<0:4> in response to the code comparison signal com_HL. For example, when the code comparison signal com_HL is activated, the operation part 351 performs the addition for the subtraction codes cut_code<0:3> and the latch codes latch_code<0:4>. However, when the code comparison signal com_HL is deactivated, the operation part 351 performs the subtraction for the subtraction codes cut_code<0:3> and the latch codes latch_code<0:4>.

The latch part 352 is configured to latch a result of the addition or subtraction performed by the operation part 351, and output the result as the latch codes latch_code<0:4>.

The first selection part 353 is configured to output the most significant bit latch_code<4> of the latch codes latch_code<0:4> as the selection signal sel, and output remaining latch codes latch_code<0:3>, as the duty information com_A<0:3> and com_B<0:3> in response to the selection signal sel. At this time, the remaining latch codes latch_code<0:3>, except for the most significant bit latch_code<4>, are output to the first current control unit 410 or the second current control unit 420 as the duty information com_A<0:3> and com_B<0:3> in response to the selection signal sel.

Figure 7:
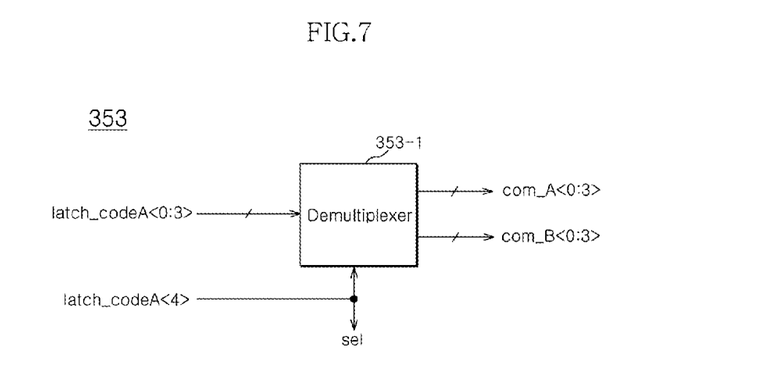
FIG. 7 is a configuration diagram of a first selection part of FIG. 6.

As illustrated in FIG. 7, the first selection part 353 may be configured with a demultiplexer 353-1. For example, when the most significant bit latch_code<4> of the latch codes latch_code<0:4> is activated (that is, a high level), the demultiplexer 353-1 outputs the latch codes latch_code<0:3>, except for the most significant bit latch_code<4>, to the first current control unit 410 as the duty information com_A<0:3>. Meanwhile, when the most significant bit latch_code<4> of the latch codes latch_code<0:4> is deactivated (that is, a low level), the demultiplexer 353-1 outputs the latch codes latch_code<0:3>, except for the most significant bit latch_code<4>, to the second current control unit 420 as the duty information com_B<0:3>. The most significant bit latch_code<4> of the latch codes latch_code<0:4> is output as the selection signal sel.

Figure 8:
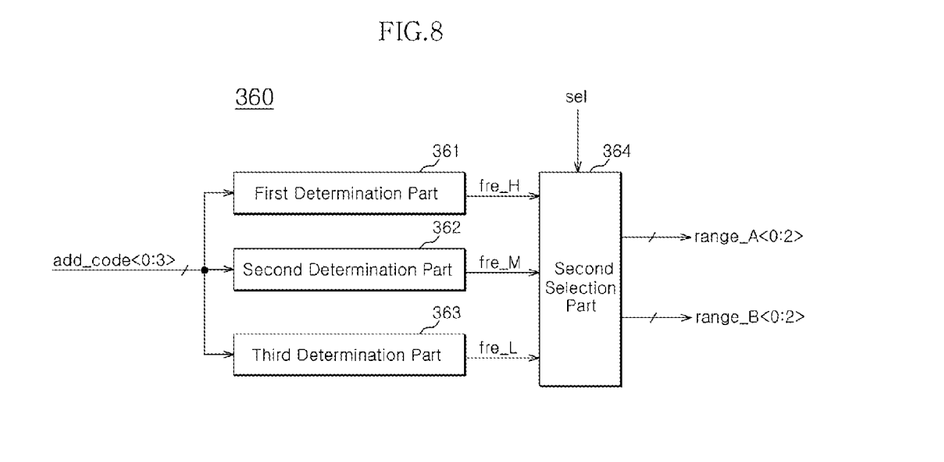
FIG. 8 is a configuration diagram of a code value determination section of FIG. 2.

As illustrated in FIG. 8, the code value determination section 360 may include first to third determination parts 361 to 363, and a second selection part 364.

When the code values of the addition codes add_code<0:3> are larger than the first setting code value, the first determination part 361 activates the first frequency signal fre_H.

When the code values of the addition codes add_code<0:3> are smaller than the first setting code value and larger than the second setting code value, the second determination part 362 activates the second frequency signal fre_M.

When the code values of the addition codes add_code<0:3> are smaller than the second setting code value, the third determination part 363 activates the third frequency signal fre_L.

The second selection part 364 is configured to output the first to third frequency signals fre_H, fre_M, and fre_L to the first current control unit 410 or the second current control unit 420 as the frequency information range_A<0:2> and range_B<0:2> in response to the selection signal sel. For example, when the selection signal sel is activated, the second selection part 364 outputs the first to third frequency signals fre_H, fre_M, and fre_L to the first current control unit 410 as the frequency information range_A<0:2>. However, when the selection signal sel is deactivated, the second selection part 364 outputs the first to third frequency signals fre_H, fre_M, and fre_L to the second current control unit 420 as the frequency information range_B<0:2>.

The duty correction circuit configured as above according to the embodiment operates as follows.

The input clock CLK_in and the inverted input clock CLK-B_in are buffered through the clock buffer 100 and are output as the buffer clock CLK_buf and the inverted buffer clock CLKB_buf. At this time, the levels of the buffer clock CLK_buf and the inverted buffer clock CLKB_buf are current mode logic (CML) levels.

The buffer clock CLK_buf and the inverted buffer clock CLKB_buf are output as the internal clock CLK_int and the inverted internal clock CLKB_int through the swing level conversion block 200. At this time, the levels of the internal clock CLK_int and the inverted internal clock CLKB_int are complementary metal oxide semiconductor (CMOS) levels.

The detection unit 310 illustrated in FIG. 2 generates the high codes H<0:3> corresponding to the size of the high pulse width of the internal clock CLK_int, and generates the low codes L<0:3> corresponding to the size of the low pulse width of the inverted internal clock CLKB_int.

The comparison section 320 compares the code values of the high codes H<0:3> with the code values of the low codes L<0:3>, and activates the code comparison signal com_HL when the code values of the high codes H<0:3> are larger than the code values of the low codes L<0:3>, and deactivates the code comparison signal com_HL when the code values of the high codes H<0:3> are smaller than the code values of the low codes L<0:3>.

When the code comparison signal com_HL is activated, the subtraction section 330 subtracts the code values of the low codes L<0:3> from the code values of the high codes H<0:3> and generates the subtraction codes cut_code<0:3>. However, when the code comparison signal com_HL is deactivated, the subtraction section 330 subtracts the code values of the high codes H<0:3> from is the code values of the low codes L<0:3> and generates the subtraction codes cut_code<0:3>.

The operation latch section 350 is configured with the operation part 351, the latch part 352, and the first selection part 353 as illustrated in FIG. 6. When the code comparison signal com_HL is activated, the operation part 351 adds the subtraction codes cut_code<0:3> to the latch codes latch_code<0:4>. However, when the code comparison signal com_HL is deactivated, the operation part 351 subtracts the subtraction codes cut_code<0:3> from the latch codes latch_code<0:4>.

The latch part 352 latches the output of the operation part 351 to output the latch codes latch_code<0:4>.

When the most significant bit latch_code<4> of the latch codes latch_code<0:4> is activated (that is, a high level), the first selection part 353 outputs the latch codes latch_code<0:3>, except for the most significant bit latch_code<4> of the latch codes latch_code<0:4>, to the first current control unit 410 as the duty information com_A<0:3>. However, when the most significant bit latch_code<4> of the latch codes latch_code<0:4> is deactivated (that is, a low level), the first selection part 353 outputs the latch codes latch_code<0:3>, except for the most significant bit latch_code<4> of the latch codes latch_code<0:4>, to the second current control unit 420 as the duty information com_B<0:3>. The most significant bit latch_code<4> of the latch codes latch_code<0:4> is output as the selection signal sel.

The addition section 340 illustrated in FIG. 2 adds the high codes H<0:3> to the low codes L<0:3> and generates the addition codes add_code<0:3>.

The code value determination section 360 includes the first to third determination parts 361 to 363, and the second selection part 364 as illustrated in FIG. 8.

When the code values of the addition codes add_code<0:3> are larger than the first setting code value, the first determination part 361 activates the first frequency signal fre_H.

When the code values of the addition codes add_code<0:3> are smaller than the first setting code value and larger than the second setting code value, the second determination part 362 activates the second frequency signal fre_M.

When the code values of the addition codes add_code<0:3> are smaller than the second setting code value, the third determination part 363 activates the third frequency signal fre_L.

When the selection signal sel is activated, the second selection part 364 outputs the first to third frequency signals fre_H, fre_M, and fre_L to the first current control unit 410 as the frequency information range_A<0:2>. However, when the selection signal sel is deactivated, the second selection part 364 outputs the first to third frequency signals fre_H, fre_M, and fre_L to the second current control unit 420 as the frequency information range_B<0:2>.

When the most significant bit latch_code<4>, that is, the selection signal sel is at a high level, the first current control unit 410 is receives the latch codes latch_code<0:3>, except for the most significant bit latch_code<4>, as the duty information com_A<0:3>, and receives the first to third frequency signals fre_H, fre_M, and fre_L as the frequency information range_A<0:2>. The first current control unit 410 controls the time point, at which the logic value of the buffer clock CLK_buf transitions, according to the frequency information range_A<0:2> and the duty information com_A<0:3>.

When the most significant bit latch_code<4>, that is, the selection signal sel is at a low level, the second current control unit 420 receives the latch codes latch_code<0:3>, except for the most significant bit latch_code<4>, as the duty information com_B<0:3>, and receives the first to third frequency signals fre_H, fre_M, and fre_L as the frequency information range_B<0:2>. The second current control unit 420 controls the time point, at which the logic value of the inverted buffer clock CLKB_buf transitions, according to the frequency information range_B<0:2> and the duty information com_B<0:3>.

The duty correction circuit according to an embodiment selectively controls the time point at which the logic value of the buffer clock CLK_buf or the inverted buffer clock CLKB_buf transitions, thereby correcting the duty of the internal clock CLK_int. Furthermore, the duty correction circuit according to an embodiment can generate the latch codes latch_code<0:4> and the frequency signals fre_H, fre_M, and fre_L, which are required for the duty correction of the internal clock CLK_int, while one period of the internal clock CLK_int passes, thereby reducing the time until the duty correction is completed. In addition, information required for the duty correction of the internal clock CLK_int is processed in a digital manner, so that the duty correction can be accurately performed without duty correction offset. Moreover, a duty correction operation is performed by determining the frequency of the internal clock CLK_int, so that a frequency range permitting the duty correction is wide as compared with the conventional art.

As described above, the transistors N1 to N14 constituting the current control block 400 may have sizes different from one another.

Since the sizes of the transistors N1 to N14 are set to be different from one another, the following effects can be obtained.

The sizes of the transistors are set to be different from one another, so that it is possible to differently set duty correction resolution according to the frequency information range_A<0:2> and range_B<0:2> or the duty information com_A<0:3> and com_B<0:3>.

Firstly, the sizes of the transistors N4 to N6 and N11 to N13 constituting the first current paths are set to be different from one another, so that it is possible to non-linearly change a duty correction range according to the frequency information range_A<0:2> and range_B<0:2>.

Consequently, a variation in a total amount of current flowing through the plurality of first current paths with respect to a is variation in the frequency information range_A<0:2> and range_B<0:2> is changed according to a frequency domain.

The variation in the frequency information range_A<0:2> and range_B<0:2> indicates a change in a frequency value. As described above, the frequency information range_A<0:2> and range_B<0:2> is generated by adding the values of the high pulse width to the values of the low pulse width of the internal clock CLK_int. Thus, the variation in the frequency information range_A<0:2> and range_B<0:2> indicates the change in the frequency value.

It is assumed that the entire frequency domain is divided into a low frequency domain, an intermediate frequency domain, and a high frequency domain, and the frequency information range_A<0:2> and range_B<0:2> is changed in each frequency domain. As the sizes of the transistors are set to be different from one another, the variation in the total amount of current flowing through the plurality of first current paths when a low frequency has been changed to an intermediate frequency may be set to be different from the variation in the total amount of current flowing through the plurality of first current paths when the intermediate frequency has been changed to a high frequency.

Secondly, the sizes of the transistors N7 to N10 and N14 to N17 constituting the second current paths are set to be different from one another, so that it is possible to non-linearly change duty correction resolution according to the duty information com_A<0:3> is and com_B<0:3>.

Consequently, a variation in the total amount of current flowing through the plurality of second current paths with respect to a variation in the duty information com_A<0:3> and com_B<0:3> is changed according to the duty information com_A<0:3> and com_B<0:3>.

The variation in the duty information com_A<0:3> and com_B<0:3> indicates the degree of a duty change. As described above, the duty information com_A<0:3> and com_B<0:3> is generated by performing the subtraction for the values of the high pulse width and the low pulse width of the internal clock CLK_int. Thus, the variation in the duty information com_A<0:3> and com_B<0:3> indicates the degree of a duty change.

As illustrated in FIGS. 3 to 7, when the duty of the internal clock CLK_int or the inverted internal clock CLKB_int is severely distorted, that is, when a large difference occurs between the high pulse width and the low pulse width of the internal clock CLK_int or the inverted internal clock CLKB_int, the duty information com_A<0:3> and com_B<0:3> have large code values.

The sizes of the transistors are set to be different from one another, so that it is possible to non-linearly adjust the total amount of current flowing through the plurality of second current paths when the code values of the duty information com_A<0:3> and com_B<0:3> is large and when the code values of the duty information com_A<0:3> and com_B<0:3> are small.

Figure 9:
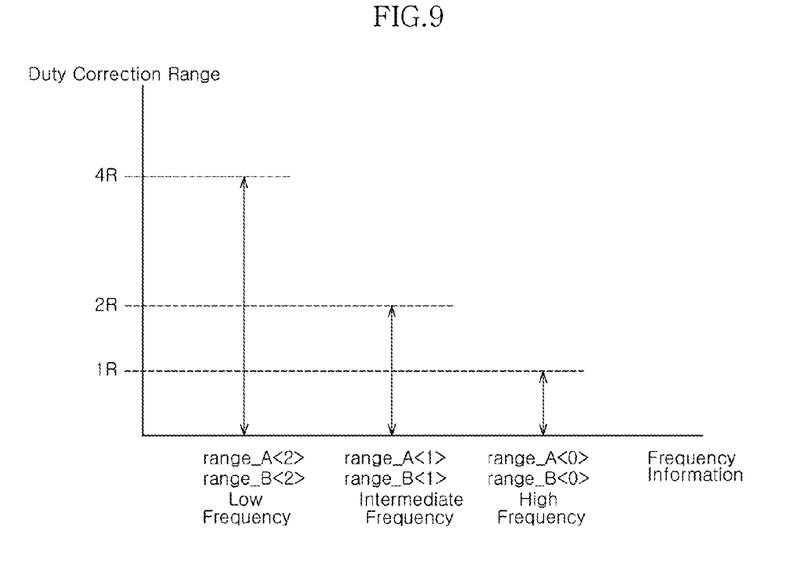
FIG. 9 is a graph illustrating a duty correction range according to frequency information of a duty correction circuit in which the sizes of transistors of a current control block 400 have been set to be different from one another.

FIG. 9 is a graph illustrating a duty correction range according to frequency information of the duty correction circuit in which the sizes of the transistors of the current control block 400 have been set to be different from one another.

In the graph illustrated in FIG. 9, the size of the fifth transistor N5 is twice as large as the fourth transistor N4, and the size of the sixth transistor N6 is twice as large as the fifth transistor N5.

When the operation frequency of the duty correction circuit is high, the frequency information range_A<0> is activated to a high level and the frequency information range_A<1:2> is deactivated to a low level.

Thus, the fourth transistor N4 is turned on and the fifth and sixth transistors N5 and N6 are turned off, so that the total amount of current flowing through the plurality of first current paths is determined by a turn-on current of the fourth transistor N4. In this case, the duty correction range of the duty correction circuit is indicated by 1R.

When the operation frequency of the duty correction circuit is intermediate, the frequency information range_A<1> is activated to a high level and the frequency information range_A<0> and range_A<2> is deactivated to a low level.

Thus, the fifth transistor N5 is turned on and the fourth and sixth transistors N4 and N6 are turned off, so that the total amount of current flowing through the plurality of first current paths is determined by a turn-on current of the fifth transistor N5. In this case, the duty correction range of the duty correction circuit is indicated by 2R. This is because the size of the fifth transistor N5 is twice as large as the fourth transistor N4.

When the operation frequency of the duty correction circuit is low, the frequency information range_A<2> is activated to a high level and the frequency information range_A<0> and range_A<1> is deactivated to a low level.

Thus, the sixth transistor N6 is turned on and the fourth and fifth transistors N4 and N5 are turned off, so that the total amount of current flowing through the plurality of first current paths is determined by a turn-on current of the sixth transistor N6. In this case, the duty correction range of the duty correction circuit is indicated by 4R. This is because the size of the sixth transistor N6 is twice as large as the fifth transistor N5.

The variation in the total amount of current flowing through the plurality of first current paths with respect to the variation in the frequency information range_A<0:2> and range_B<0:2> is set to be changed according to the frequency domain, so that it is possible to obtain excellent operational characteristics of the duty correction to circuit.

For example, the duty correction circuit having the duty correction range of 1R in the high frequency domain according to an embodiment can precisely perform duty correction in the high frequency domain. This characteristic allows jitter of the duty is correction circuit in the high frequency domain to be reduced.

For another example, the duty correction circuit having the duty correction range of 4R in the low frequency domain according to an embodiment can perform a wide range of duty correction per a unit duty correction operation in the low frequency domain. In general, a clock signal is insensitive to jitter in the low frequency domain as compared with the high frequency domain. Consequently, the duty correction circuit according to the embodiment performs a wide range of duty correction per a unit duty correction operation in the low frequency domain, thereby reducing a duty correction time.

For example, when the variation in the frequency information range_A<0:2> and range_B<0:2> is a (a real number larger than 0) and the total amount of current flowing through the plurality of first current paths is b (a real number larger than 0), the value of the b is set to be proportional to the square of c (a real number larger than 1) of the a, so that a non-linear relation may be set between the b and the a.

Figure 10:
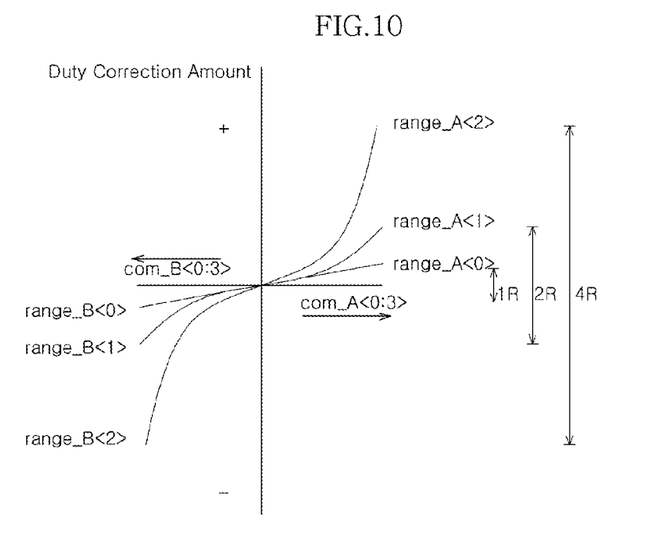
FIG. 10 is a graph illustrating a duty correction amount according to duty information of the duty correction circuit in which the sizes of transistors of a current control block 400 have been set to be different from one another.

FIG. 10 is a graph illustrating a duty correction amount according to duty information of the duty correction circuit in which the sizes of the transistors of the current control block 400 have been set to be different from one another.

As illustrated in FIG. 10, with an increase in the duty information com_A<0:3> and com_B<0:3>, the duty correction amount of the duty correction circuit may be non-linearly increased.

Furthermore, with an increase in the frequency information range_A<0:2> and range_B<0:2>, the duty correction range of the duty correction circuit may be non-linearly increased.

While certain embodiments have been described above, it will be understood to those skilled in the art that the embodiments described are by way of example only. Accordingly, the duty correction circuit described herein should not be limited based on the described embodiments. Rather, the duty correction circuit described herein should only be limited in light of the claims that follow when taken in conjunction with the above description and accompanying drawings.

What is claimed is:

1. A duty correction circuit comprising:
   a clock buffer configured to buffer an input clock and generate a buffer clock;
   a swing level conversion block configured to generate an internal clock, which transitions to levels of a sync voltage and a power supply voltage, in response to a voltage level of the buffer clock;
   a duty control block configured to generate duty information and frequency information by using a high pulse width and a low pulse width of the internal clock; and
   a current control block configured to control a time point, at which a logic value of the buffer clock transitions, in response to the is duty information and the frequency information,
   wherein the current control block comprises:
   a plurality of first current paths coupled in parallel to one another in order to control the time point at which the logic value of the buffer clock transitions,
   wherein a total amount of current flowing through the plurality of first current paths is controlled in response to the frequency information, and
   a variation in the total amount of current flowing through the plurality of first current paths with respect to a variation in the frequency information is changed according to a frequency domain.

2. The duty correction circuit according to claim 1, wherein a variation b in the total amount of current flowing through the plurality of first current paths with respect to a variation a in the frequency information has a value proportional to square of c of the a, the a and the b are real numbers larger than 0, and the c is a real number larger than 1.

3. The duty correction circuit according to claim 1, wherein each of the plurality of first current paths includes two or more transistors controlled in response to the frequency information, and the two or more transistors have sizes different from each other.

4. The duty correction circuit according to claim 3, wherein the frequency information is a digital code of plural bits, and each of the transistors receives the digital code of plural bits through a gate terminal thereof by one bit.

5. The duty correction circuit according to claim 4, wherein an amplitude of a frequency, which is represented by one bit of the digital code received in the gate terminal of a transistor with a large size, is smaller than an amplitude of a frequency which is represented by another bit of the digital code received in the gate terminal of a transistor with a small size, wherein the small transistor is smaller than the large transistor.

6. The duty correction circuit according to claim 4, wherein the transistors comprise:
   first to third transistors having sizes different from one another,
   wherein a size of the second transistor is larger than a size of the first transistor and smaller than a size of the third transistor, and
   a difference between the size of the second transistor and the size of the first transistor is different from a difference between the size of the third transistor and the size of the second transistor.

7. The duty correction circuit according to claim 6, wherein the difference between the size of the third transistor and the size of the second transistor is larger than the difference between the size of the second transistor and the size of the first transistor.

8. The duty correction circuit according to claim 7, wherein, among the first to third transistors, an amplitude of a frequency, which is represented by one bit of the digital code received in the gate terminal of the transistor with a large size, is smaller than an amplitude of a frequency which is represented by another bit of the digital code received in the gate terminal of the transistor with a small size.

9. The duty correction circuit according to claim 1, wherein the current control block comprises:
   a plurality of second current paths coupled in series to the plurality of first current paths,
   wherein a total amount of current flowing through the plurality of second current paths is controlled in response to the duty information.

10. The duty correction circuit according to claim 9, wherein the duty information is a digital code of plural bits, and each of the plurality of second current paths is controlled according to each bit of the digital code of plural bits.

11. The duty correction circuit according to claim 10, wherein each of the plurality of second current paths comprises:
    a transistor that receives the bits of the digital code through a gate terminal thereof by one bit.

12. The duty correction circuit according to claim 1, wherein the current control block is coupled to a node through which the clock buffer is coupled to the swing level conversion block, and controls a voltage level of the buffer clock in response to the duty information and the frequency information.

13. The duty correction circuit according to claim 12, wherein the current control block comprises:
    a first transistor and a second transistor coupled in series to each other between an output terminal and a ground terminal of the clock buffer,
    wherein the first transistor receives the frequency information through a gate terminal thereof, and
    the second transistor receives the duty information through a gate terminal thereof.

14. The duty correction circuit according to claim 1, wherein the buffer clock has a current mode logic (CML) level and the internal clock has a complementary metal oxide semiconductor (CMOS) level.

15. The duty correction circuit according to claim 1, wherein the duty control block is configured to generate a size difference between the high pulse width and the low pulse width of the internal is clock as the duty information, and generate a size sum of the high pulse width and the low pulse width of the internal clock as the frequency information.

16. The duty correction circuit according to claim 15, wherein the duty control block comprises:

a detection unit configured to generate a high code having a code value corresponding to the high pulse width of the internal clock, and generate a low code having a code value corresponding to the low pulse width of the internal clock;

a duty information generation unit configured to generate a subtraction code by subtracting a code having a small code value of the high code and the low code from a code having a large code value of the high code and the low code, and generate the duty information based on the subtraction code; and a frequency information generation unit configured to generate an addition code by adding duty control block code value of the high code to duty control block code value of the low code, and generate the frequency information based on the addition code.

17. The duty correction circuit according to claim 16, wherein the detection unit comprises:

a code generation section configured to detect the high pulse width or the low pulse width of the internal clock in response to a control signal, and output a detection result as a detection code;

a first latch section configured to latch the detection code in response to the control signal, and output the latched detection code as the high code; and a second latch section configured to latch the detection code in response to the control signal, and output the latched detection code as the low code.

18. The duty correction circuit according to claim 17, wherein the detection code includes first to third detection signals, wherein the code generation section comprises:

a detection selection part configured to output the internal clock to a first output terminal thereof and an inverted clock of the internal clock to a second output terminal thereof when the control signal is activated, and output the inverted clock to the first output terminal and the internal clock to the second output terminal when the control signal is deactivated;

a first delay part configured to delay a signal which is output from the first output terminal of the detection selection part;

a first phase comparison part configured to compare a phase of an output signal of the first delay part with a phase of a signal which is output from the second output terminal of the detection selection part, and generate the first detection signal;

a first selection delay part configured to delay the output signal of the first delay part or the output signal of the detection selection part in response to the first detection signal, and output a delayed is signal to a first output terminal or a second output terminal thereof;

a second phase comparison part configured to compare a phase of a signal which is output from the first output terminal of the first selection delay part with a phase of a signal which is output from the second output terminal of the first selection delay part, and generate the second detection signal;

a second selection delay part configured to delay one of the signals, which are output from the first and second output terminals of the first selection delay part, in response to the second detection signal, and output a delayed signal to a first output terminal or a second output terminal thereof; and a third phase comparison part configured to compare phases of signals, which are output from the first and second output terminals of the second selection delay part, with each other, and generate the third detection signal.

19. The duty correction circuit according to claim 18, wherein when the first detection signal is activated, the first selection delay part delays the output signal of the first delay part to output the delayed signal to the first output terminal, and outputs the signal, which is output from the second output terminal of the detection selection part, to the second output terminal, and when the first detection signal is deactivated, the first selection delay part outputs the output signal of the first delay part to the first output terminal and delays the signal, which is output from the is second output terminal of the detection selection part, to output the delayed signal to the second output terminal.

20. The duty correction circuit according to claim 19, wherein the first selection delay part comprises:

a first multiplexer configured to output the output signal of the first delay part or the signal, which is output from the second output terminal of the detection selection part, in response to the first detection signal;

a second multiplexer configured to output the output signal of the first delay part or the signal, which is output from the second output terminal of the detection selection part, in response to the first detection signal;

a second delay portion configured to delay an output signal of the second multiplexer;

a third multiplexer configured to output one of an output signal of the first multiplexer and an output signal of the second delay portion to the first output terminal in response to the first detection signal; and a fourth multiplexer configured to output one of the output signal of the first multiplexer and the output signal of the second delay portion to the second output terminal in response to the first detection signal.

21. The duty correction circuit according to claim 16, wherein is the duty information generation unit comprises:

a comparison section configured to compare the code value of the high code with the code value of the low code and generate a code comparison signal;

a subtraction section configured to subtract a small one of the code values of the high code and the low code from a large one of the code values of the high code and the low code in response to the code comparison signal, and output a subtraction result as the subtraction code; and an operation latch section configured to perform subtraction or addition for the subtraction code and a latch code in response to the code comparison signal, and output a subtraction or addition result as the duty information.

22. The duty correction circuit according to claim 21, wherein, when the code value of the high code is larger than the code value of the low code, the comparison section activates the code comparison signal, and when the code value of the high code is smaller than the code value of the low code, the comparison section deactivates the code comparison signal.

23. The duty correction circuit according to claim 22, wherein the operation latch section comprises:

an operation part configured to perform addition for the subtraction code and the latch code when the code comparison signal is activated, and perform subtraction for the subtraction code and the latch code when the code comparison signal is deactivated;

a latch part configured to latch output of the operation part and generate the latch code; and a selection part configured to output a most significant bit of the latch code as a selection signal, and output the latch code as the duty information.

24. The duty correction circuit according to claim 16, wherein the frequency information includes first to third frequency signals, and the frequency information generation unit comprises:

an addition section configured to add the high code to the low code and generate the addition code; and a code value determination section configured to activate the first frequency signal of the first to third frequency signals when a code value of the addition code is larger than a first setting code value, activate the second frequency signal of the first to third frequency signals when the code value of the addition code is smaller than the first setting code value and larger than a second setting code value, and activate the third frequency signal of the first to third frequency signals when the code value of the addition code is smaller than the second setting code value.

25. The duty correction circuit according to claim 1, wherein is the buffer clock comprises:

a first buffer clock; and a second buffer clock, wherein the current control block comprises:

a first current control unit configured to control a time point at which a logic value of the first buffer clock transitions; and a second current control unit configured to control a time point at which a logic value of the second buffer clock transitions, wherein only one of the first current control unit and the second current control unit is selected and activated.

26. A duty correction circuit comprising:

a current control block configured to receive duty information and frequency information and control a time point at which a logic value of a buffer clock transitions in response to the duty information and the frequency information, wherein the current control block further comprises:

a plurality of current paths coupled in parallel to one another in order to control the time point at which the logic value transitions, wherein a total amount of current flowing through the plurality of first current paths is controlled in response to the frequency information, and a variation in the total amount of current flowing through the plurality of first current paths with respect to a variation in the frequency information is changed according to a frequency domain.

* * * * *